(12) United States Patent
Yair et al.

(10) Patent No.: US 7,106,584 B2
(45) Date of Patent: Sep. 12, 2006

(54) FASCIA PANEL FOR ELECTRONICS ASSEMBLY

(75) Inventors: Andrew John Yair, Swindon (GB); John David Schnabel, Fareham (GB)

(73) Assignee: Sun Microsystems, Inc., Santa Clara, CA (US)

( * ) Notice: Subject to any disclaimer, the term of this patent is extended or adjusted under 35 U.S.C. 154(b) by 276 days.

(21) Appl. No.: 10/452,785

(22) Filed: Jun. 2, 2003

(65) Prior Publication Data

US 2004/0052041 A1 Mar. 18, 2004

(30) Foreign Application Priority Data

Jun. 10, 2002 (GB) ................... 0213248.8

(51) Int. Cl.
*G06F 1/16* (2006.01)
(52) U.S. Cl. .................. 361/686; 361/797; 361/741
(58) Field of Classification Search ............. 361/797, 361/686, 728, 740, 741, 747, 759
See application file for complete search history.

(56) References Cited

U.S. PATENT DOCUMENTS

| | | | |
|---|---|---|---|
| 5,095,403 A | | 3/1992 | Pin et al. |
| 5,121,296 A | * | 6/1992 | Hsu .......................... 361/685 |
| 5,465,838 A | | 11/1995 | Hollander et al. |
| 5,783,777 A | | 7/1998 | Kruse et al. |
| 5,852,594 A | * | 12/1998 | Kaise et al. ................ 720/647 |
| 5,969,245 A | * | 10/1999 | Chiang ........................ 73/431 |
| 6,061,250 A | | 5/2000 | Lavan |
| 6,122,173 A | * | 9/2000 | Felcman et al. ............ 361/726 |
| 6,157,534 A | | 12/2000 | Gallagher et al. |
| 6,185,110 B1 | * | 2/2001 | Liu ............................ 361/829 |
| 6,504,731 B1 | | 1/2003 | Okamoto |
| 6,552,914 B1 | * | 4/2003 | Chang ........................ 361/796 |
| 6,678,165 B1 | | 1/2004 | Kawada et al. |
| 6,724,635 B1 | * | 4/2004 | Larson et al. ............... 361/736 |
| 2001/0053067 A1 | * | 12/2001 | Wortman ..................... 361/752 |

FOREIGN PATENT DOCUMENTS

| | | |
|---|---|---|
| EP | 0242970 | 3/1987 |
| EP | 0505938 | 3/1992 |
| GB | 2245801 | 1/1992 |
| GB | 2360932 | 10/2001 |

OTHER PUBLICATIONS

International search report application No. GB0213248.8 mailed Oct. 24, 2002.

* cited by examiner

*Primary Examiner*—Kamand Cuneo
*Assistant Examiner*—Ivan Carpio
(74) *Attorney, Agent, or Firm*—Meyertons Hood Kivlin Kowert & Goetzel, P.C.; B. Noël Kivlin

(57) ABSTRACT

An electronics assembly, for example for use as a network server, comprises a frame that encloses a number of components of the assembly, a facia panel that is attached to a surface of the frame, and is formed as an upper and a lower part that are retained together generally horizontally. The assembly includes a printed circuit board for providing information relating to the assembly, the printed circuit board being located within the facia panel between the two parts. The frame and the fascia panel have a locating element at each side of the fascia panel for ensuring correct positioning of the panel with respect to the frame.

23 Claims, 5 Drawing Sheets

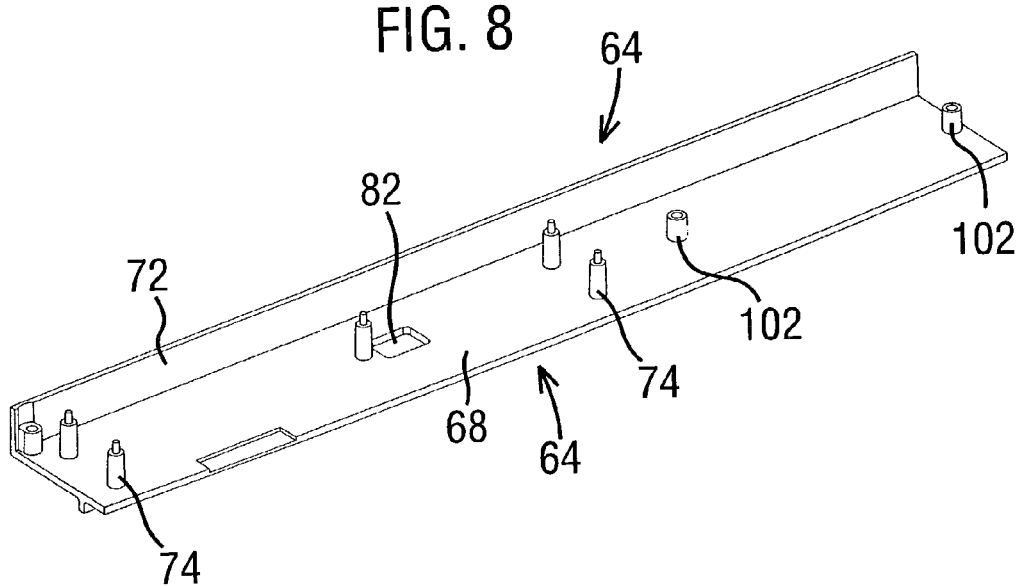
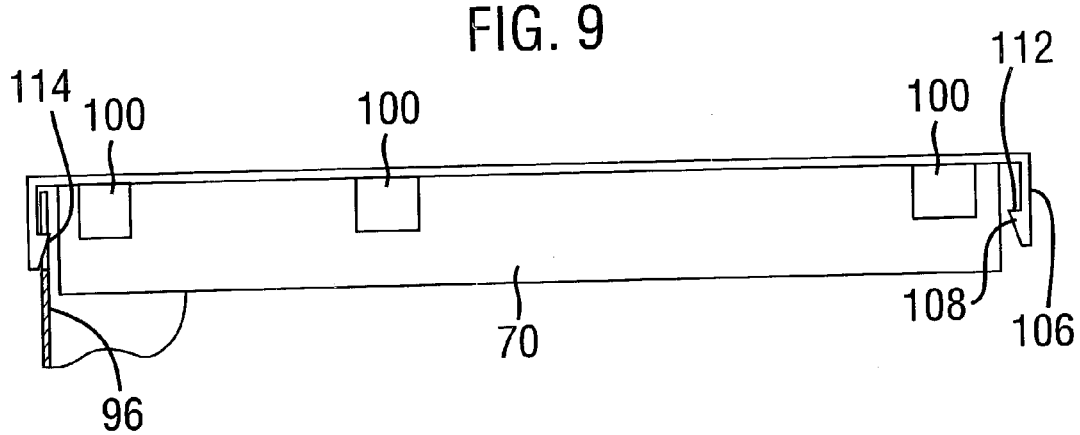
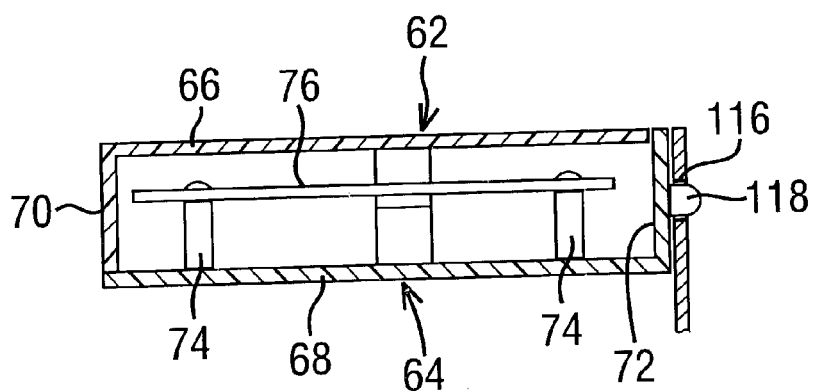

FASCIA PANEL FOR ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch cabinets or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting chassis or frame that houses a motherboard or backplane and a number of daughterboards or module cards that extend in planes generally perpendicular to the plane of the motherboard. One form of assembly includes so-called "RAS computers" that is to say, computers that need to provide a high degree of reliability, availability and serviceability, and which therefore need to maximise the length of time during which the computer is operational.

Where any parts of the computer need to be replaced, it is advantageous if they can be replaced without needing to switch the computer off. The serviceability, including typical time to replace parts and special tool requirements can also contribute to the system availability by affecting the probability of repair success.

SUMMARY OF THE INVENTION

According to one aspect of the present invention, there is provided an assembly that includes a facia panel that contains a printed circuit board (pcb) for providing information relating to the assembly, and is formed in a number of parts for ease of installation and/or maintenance.

Thus, according to another aspect, the invention provides an electronics assembly comprising:
   (i) a frame that encloses a number of components of the assembly;
   (ii) a facia panel that is attached to a surface of the frame, the facia panel being formed as an upper and a lower part that are retained together generally horizontally; and
   (iii) a printed circuit board for providing information relating to the assembly, the printed circuit board being located within the facia panel between the two parts;
wherein, the frame and/or the facia panel have a locating element at each side of the fascia panel for ensuring correct positioning of the panel with respect to the frame.

The invention has the advantage that it is possible to form the panel so that it is relatively quick and easy to replace if necessary during maintenance, thereby reducing the length of downtime of the system. Indeed, it is possible in some instances, to replace certain components of the panel, or even the entire panel, without the need to switch off the assembly.

The panel will normally have a vertical surface that is directed away from the frame so that it is visible and has one or more apertures therein in order to enable the information to be observed, for example by means of LEDs or other display devices. It is possible for the vertical surface to be formed by both parts of the panel, or it may be formed by a single part, either the upper or the lower part.

The upper and lower parts of the panel may be retained together by means of clips on one of the upper and lower parts that engage corresponding recesses on the other of the upper and lower parts. For example, a vertical surface on one of the parts may receive corresponding clips that are formed on a horizontal surface of the other part.

In one embodiment, one of the parts may have a vertical surface that is positioned against the frame, and may be secured to it. This vertical surface may have one or more clips or recesses that engage corresponding recesses or clips in the upper part of the panel. If the panel, or at least the upper part thereof is sufficiently flexible, it is possible for a service engineer to separate the two panels simply by pulling the upper part away from the vertical surface of the lower part that is attached to the surface of the frame.

According to another aspect of the invention, there is provided a frame for an electronics assembly, which has:
   (i) a facia panel that is attached to a surface of the frame, the facia panel being formed as an upper and a lower part that are retained together generally horizontally, and
   (ii) a printed circuit board for providing information relating to the assembly, the printed circuit board being located within the facia panel between the two parts;
wherein, the frame and the fascia panel have a locating element at each side of the fascia panel for ensuring correct positioning of the panel with respect to the frame.

The facia panel that is employed in the assembly is novel per se, and so, according to yet another aspect, there is provided fascia panel that can be attached to a frame of an electronics assembly, the panel comprising:
   (i) an upper and a lower part that are retained together generally horizontally, and
   (ii) a printed circuit board for providing information relating to the assembly, the printed circuit board being located within the facia panel between the two parts;
wherein, the frame and the fascia panel have a locating element at each side of the fascia panel for ensuring correct positioning of the panel with respect to the frame.

BRIEF DESCRIPTION OF THE DRAWINGS

Embodiments of the present invention will now be described in detail, by way of example, with reference to the accompanying drawings, in which corresponding parts are given like reference numbers. In the drawings:

FIG. 8 is a perspective view of the lower part of a panel according to the second embodiment of the invention;

FIG. 9 is a front elevation of a panel according to the second embodiment of the invention; and FIG. 10 is a cross-sectional view of the panel of the second embodiment of the invention when attached to the front surface of a rack.

DESCRIPTION OF PARTICULAR EMBODIMENTS

Figure 1:
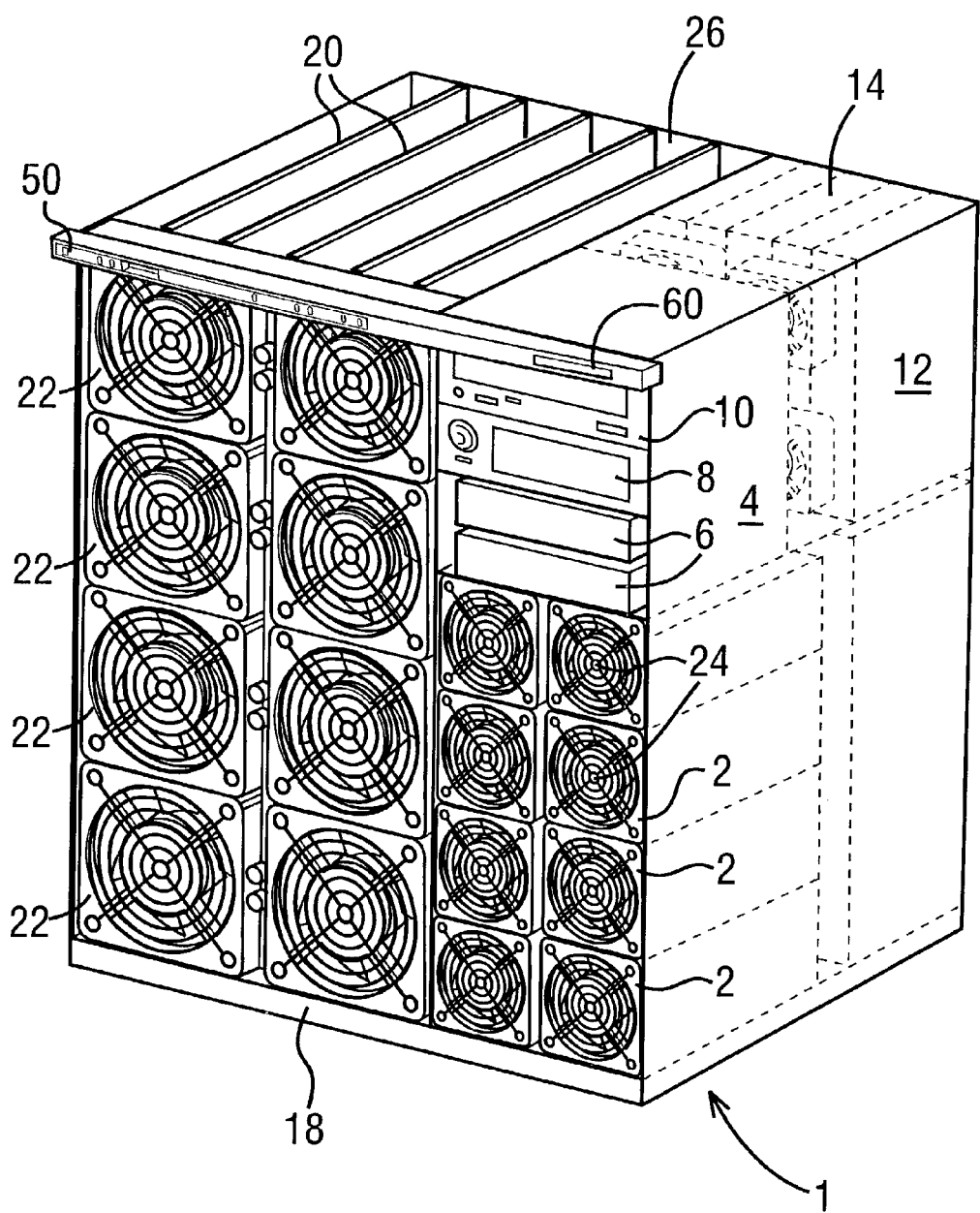
FIG. 1 is a perspective view of an electronics assembly according to one embodiment of the present invention.

Referring now to the drawings, in which like reference numerals are used to designate corresponding elements, FIG. 1 shows an assembly according to one embodiment of the invention that forms part of a server that may be employed for a number of services, for example as part of a local area network (LAN) or for other telecommunications purposes, and is designed to fit into, for example, a nineteen inch rack electronics cabinet. Other sizes may alternatively be employed, for example to fit into 23 inch or metric racks. The assembly may be designed to be a so-called "RAS" system, that is to say, to have high reliability, availability and serviceability. As such, it is intended that the system will operated with the minimum amount of down time, and so a degree of redundancy is incorporated so that the system will continue to operate even when certain components have failed. In addition, servicing of the equipment should take as short a time as possible, and, where practical, components can be replaced without switching the system off.

The assembly comprises a chassis or frame 1 in which the various components are located. The chassis contains a number of power modules 2 for converting mains a.c. power or d.c. supply to an appropriate d.c. voltage, a media area 4 that contains hard disc drives 6, a tape drive 8 and a CD-ROM or digital video disc drive or digital versatile disc (DVD) drive 10, and a part 12 that contains a number of input/output (I/O) cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc. Also a number of fans 22 are provided in an array at the front of the chassis in order to blow air through the assembly between the daughterboards 20 for cooling.

Figure 2:
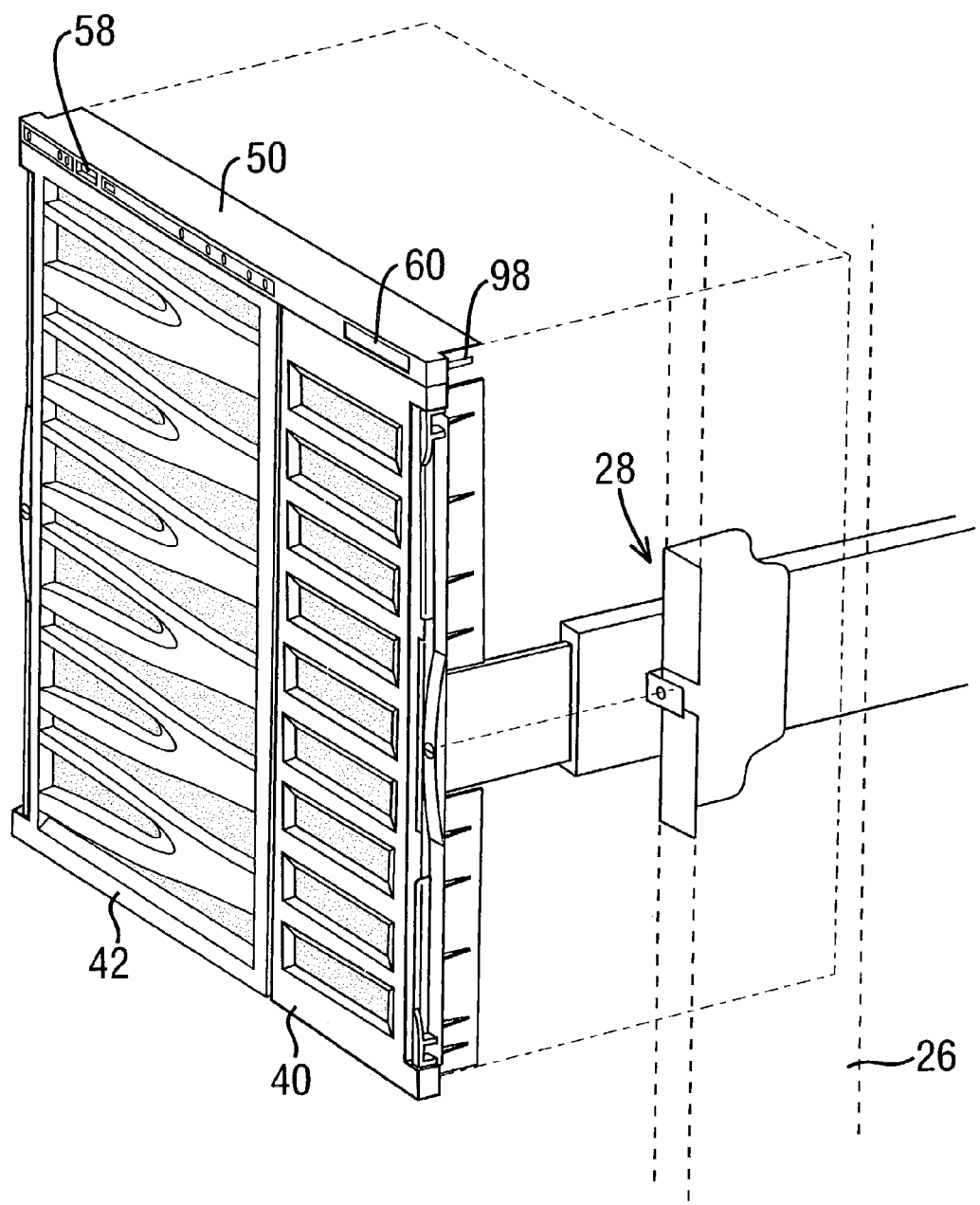
FIG. 2 is a perspective view of the electronics assembly shown in FIG. 1 together with facia doors thereon.

FIG. 2 shows the assembly of FIG. 1 when installed in a rack. The rack is formed by pillars 26 on which are located telescopic arms 28 that allow the assembly to be pulled out of the rack, for example for maintenance work, and then to be pushed back into the rack. The frame or chassis 1 is obscured behind two doors 40 and 42 that contain air filters for filtering air that is blown through the assembly by the fans 22.

Figure 4:
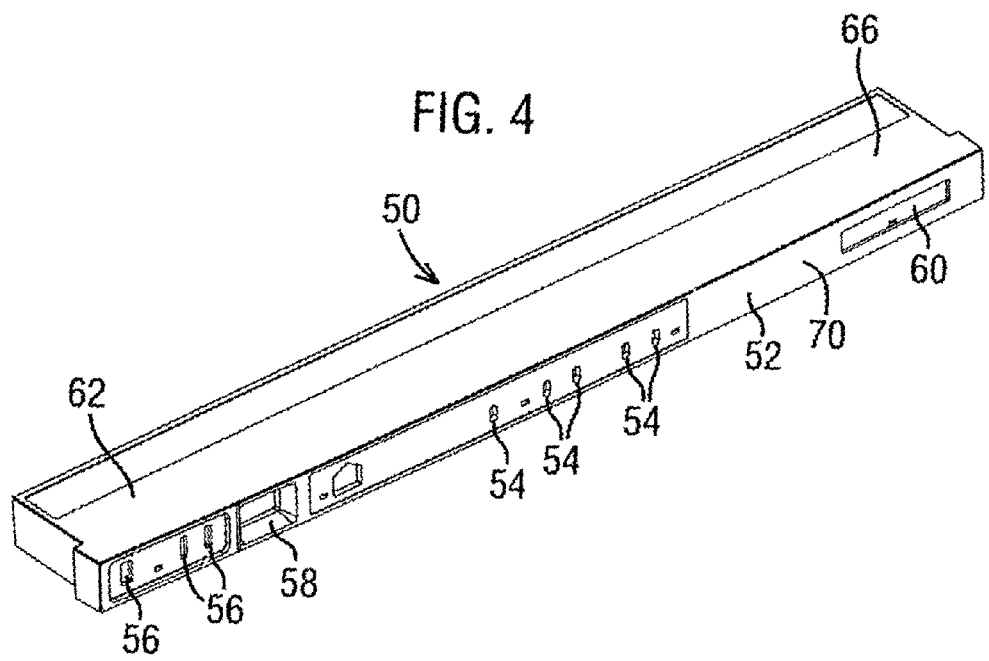
FIG. 4 is a perspective view of an upper part of the panel.

At the top of the assembly, a fascia panel is provided. This panel is located immediately above the doors 40 and 42 and extends across the chassis from one side thereof to the other. The fascia panel may be formed from plastics, metal or other suitable material, and the outwardly facing, visible surface of a typical panel is shown in FIG. 4. The panel has a front, vertical surface 52 that has a number of apertures for allowing display elements such as LEDs or other devices that indicate the state of the assembly to be observed, and includes other apertures, for example aperture 58 for an on/off switch, and aperture 60 for insertion and removal of a disc of a disc drive.

Figure 3:
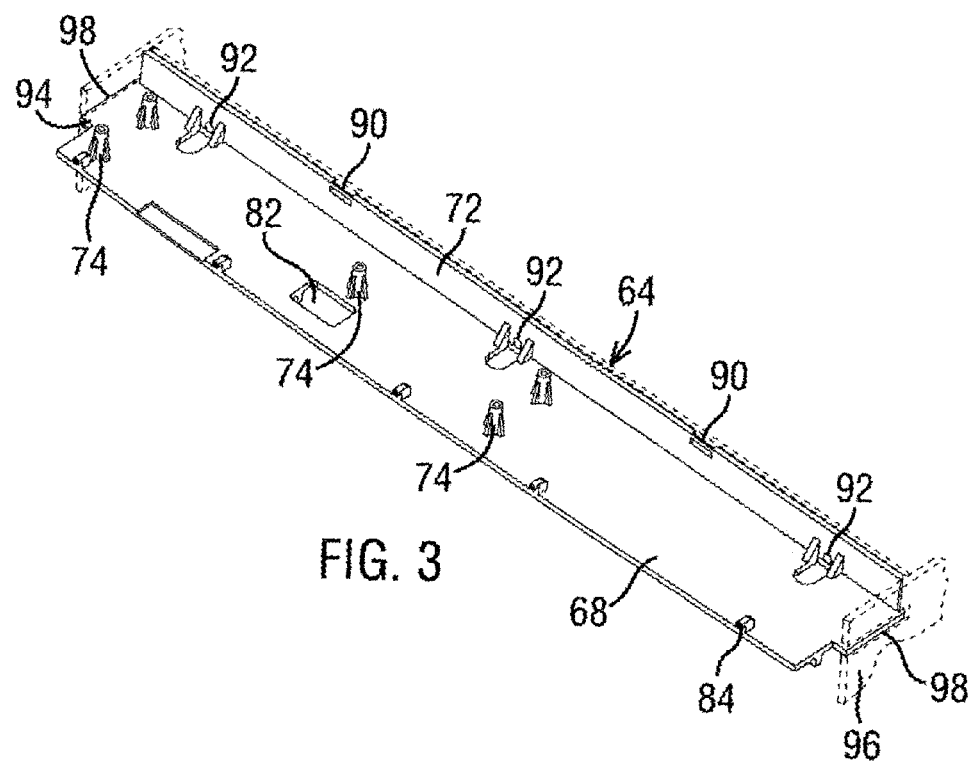
FIG. 3 is a perspective view of a lower part of a fascia panel according to one embodiment of the present invention mounted in part of a frame of the assembly.
Figure 5:
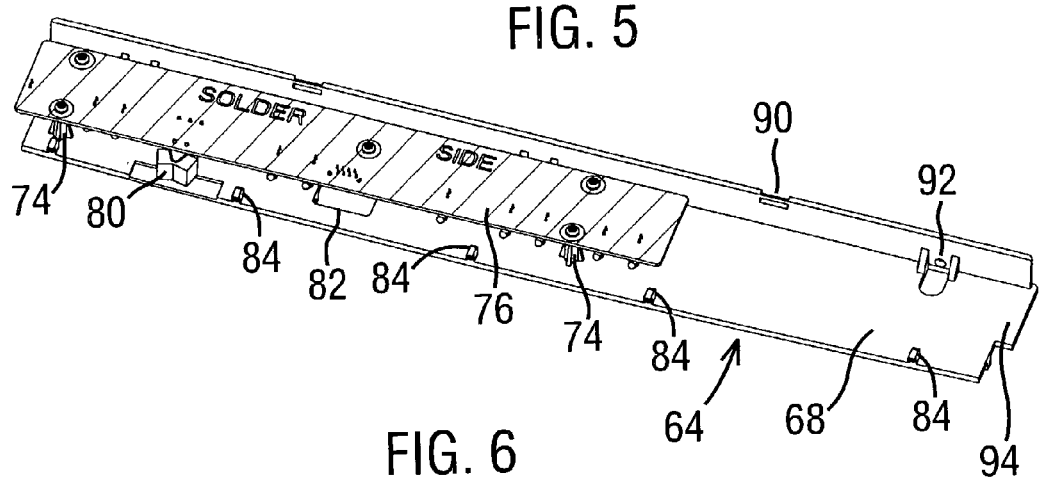
FIG. 5 is a perspective view of a panel as shown in FIG. 2 together with a printed circuit board.

The panel may be formed in two parts, for example an upper part 62 as shown in FIG. 4 and a lower part 64 as shown in FIGS. 3 and 5. The upper and lower parts 62 and 64 of the panel each have a horizontal surface 66 and 68 respectively, the upper part also having a vertical surface 70 at the front of the panel that can be viewed by users of the assembly, and the lower part 64 having a corresponding vertical surface 72 that is positioned against the front of the frame or chassis 1. It is possible for the visible vertical surface 70 to be formed on the lower part 64 of the panel and the vertical surface 72 positioned against the frame to be formed on the upper part 62. Alternatively, it is possible for a portion of each vertical surface to be formed on each of the upper and lower parts 62 and 64 of the panel.

Figure 6:
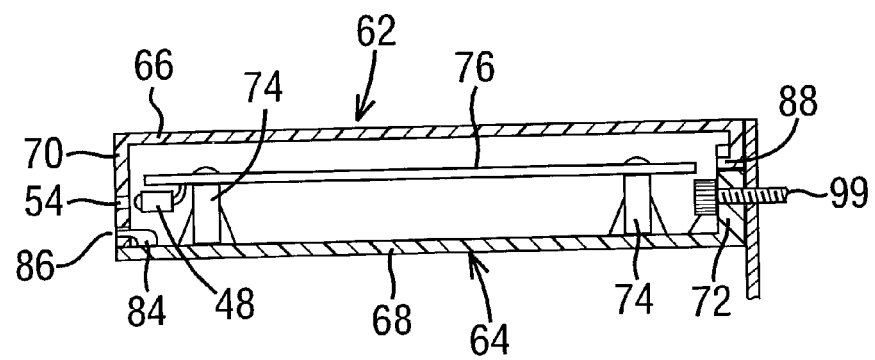
FIG. 6 is a cross-sectional view of the panel as shown in FIGS. 3 to 5 when attached to the frame.
Figure 7:
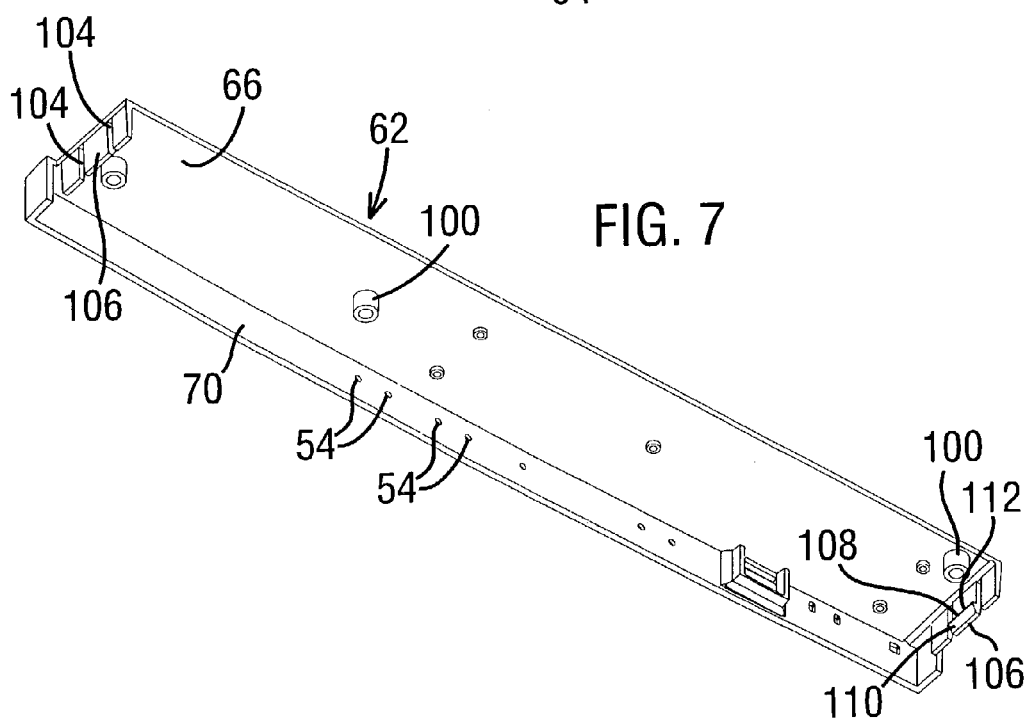
FIG. 7 is a perspective view of the upper part of a panel according to a second embodiment of the invention.

The upper part 62 and lower part 64 can be positioned together as shown in FIG. 6 which is a transverse cross-sectional view of the panel formed from both parts. The lower part 64 has a number of posts 74 on its horizontal surface 68 that support a printed circuit board 76 sandwiched between the upper and lower parts. The printed circuit board 76 has a number of components that can provide display elements with information relating to the running of the assembly. For example, LEDs 48 may be located on the board 76 which can provide a visual indication through apertures 54 in the vertical surface of the upper part. In addition, an on/off switch 80 may be provided on the board 76 and operable by a user via aperture 58. The height of the posts 74 may be such that the board is spaced apart from the upper and the lower horizontal surfaces, for example, they may be separated from the surfaces by a sufficient distance to ensure heat dissipation therefrom or in order to make assembly and maintenance easier. The posts may be located on the horizontal surface of the upper part 62 if desired.

An aperture 82 is provided in the horizontal surface 68 of the lower part 64 below part of the board 76 in order to allow a ribbon cable or other cable to extend from the board to a connector attached thereto outside the panel.

The lower part 64 may have a number of clips or hooks 84 at the edge of the horizontal surface that can be received in recesses 86 located at the bottom edge of the vertical surface 70 of the upper part in order to retain the front portions of the two parts together. Corresponding clips 88 can be located at the rear of the horizontal surface 66 of the upper part 62 which can be received in recesses 90 at the top of the vertical surface 72 that is positioned against the frame. As an alternative to discrete clips and recesses, either the upper or lower part may be provided with a continuous lip that can be received in a continuous recess extending along the edge of the part.

The vertical surface 72 of the lower part 64 may have a number of holes 92 which can receive screws or captive fasteners for securing the panel to the front surface of the frame. In addition, the lower part 64 may have a projection 94 that extends laterally from each side of the horizontal surface 68 of the part. The frame 1 may have a pair of vertical flanges 96 that extend along either side thereof, each flange 96 having a horizontal slot 98 that enables the projections 94 to be located therein for correctly positioning the panel at the front of the frame. The slots 98 may also serve to resist any movement of the panel in the vertical direction.

In order to install the panel, the lower part 64 may first be positioned against the front surface of the frame by guiding the projections 94 into the slots 98 in the flanges 96 of the frame, and the lower part is then screwed or otherwise fastened to the frame by means of screws or captive fasteners 99. The upper part 62 can then be positioned on the lower part 64 by engaging the clips or hooks 84 in the recesses 86 in the front surface 70 of the upper part, and then rotating the upper part 62 about the line of the hooks 84 until the rear edge of the horizontal surface of the upper part contacts the vertical surface 72 of the lower part. The two parts can then be squeezed together in order to engage the clips 88 and recesses 90 at the back of the panel. The connector of the cable (not shown) extending through the aperture 82 can then be connected to the relevant components of the assembly.

In this embodiment, the upper part 62 can be removed manually simply by pulling the rear edge of the horizontal surface 62 from the vertical surface 72 of the lower part 64 in order to expose the printed circuit board 76, and allow any changes to be effected.

FIGS. 7 to 10 show an alternative embodiment of the invention. This embodiment is generally the same as the embodiment shown in FIGS. 3 to 6, and comprises an upper part 62 having a front, visible surface 70, shown in FIG. 7, and a lower part 64 shown in FIG. 8 having a vertical surface that is positioned against the frame 1. The two parts are positioned together about a printed circuit board (not shown) that is positioned on posts 74 so that devices such as LEDs can indicate information regarding the operation of the assembly.

In this embodiment, however, the upper part 62 and the lower part 64 may be fixed together by means of screws or other fasteners (not shown) that are positioned in hollow posts 100 on the horizontal surface 66 of the upper part 62 and corresponding posts 102 on the horizontal surface 68 of the lower part 64 so that the panel can be attached to the front of the frame as a single item.

The upper part 62 of the panel has a wall at each side thereof that has a pair of slots 104 extending over its height in order to divide the wall into three parts. The middle part forms a resilient retaining arm 106 that has a tooth 108 at the lower end region thereof. The tooth 108 has a bevelled lower part 110 and terminates at its upper end at a shoulder 112. As an alternative, the resilient retaining arm may constitute the entire side wall of the panel, or it may be provided in addition to the side wall if desired. Also, the resilient retaining arm 106 need not extend vertically from the upper part 62 of the panel, but could, for example, extend horizontally from the front vertical surface 70 thereof.

FIG. 9 is a schematic front view of this embodiment together with part of the frame 1. The frame 1 is similar to that shown in FIG. 3 and has a vertical flange 96 at each side thereof, but instead of a slot 98, each flange has an aperture 114. In addition the front of the frame has a number of location holes 116, and the vertical surface of the lower part 64 has a number of protuberances 118 that correspond to the location holes 116.

In order to install this form of panel, it is simply positioned against the front surface of the frame so that the protuberances 118 are received in the holes 116, and the front part of the panel is pushed downwards to that the retaining arm 106 is forced outwardly by the top of the vertical flanges 96 until the tooth 108 of the retaining arm is engaged in the aperture 114. Once the tooth is located in the aperture, the panel is retained on the frame against upward movement by the shoulder 112 on the retaining arm, and by the protuberances 118, and against forward movement by means of the front end of the tooth 108 of the retaining arm that is engaged in the aperture 114. The panel can, however, easily be removed by manually forcing the retaining arms 106 outwardly, whereupon the panel can be pulled away from the frame 1.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

The invention claimed is:

1. A network server assembly, comprising:
   (i) a frame that encloses a number of components of the assembly, including:
      a motherboard; and
      a plurality of daughterboards coupled to the motherboard;
   (ii) a facia panel that is attached to a surface of the frame, the facia panel being formed as an upper and a lower part that are retained together, through at least one detachable fastener, generally horizontally; and
   (iii) a printed circuit board for providing information relating to the assembly, the printed circuit board being located within the facia panel between the two parts;
   wherein, the frame and/or the fascia panel have a locating element at each side of the fascia panel for ensuring correct positioning of the panel with respect to the frame.

2. The assembly as claimed in claim 1, wherein the panel has a vertical surface that is visible and is formed as part of the upper or lower part, the vertical surface having one or more apertures therein in order to enable the information to be observed.

3. The assembly as claimed in claim 1, wherein the upper and the lower part are retained together by means of clips on one of the upper and lower parts that engage corresponding recesses on the other of the upper and lower parts.

4. The assembly as claimed in claim 3, wherein the panel has a vertical surface that is visible and is formed as part of the upper or lower part, the vertical surface having one or more recesses that receive corresponding clips that are formed on a horizontal surface of one of the parts.

5. The assembly as claimed in claim 1, wherein one of the upper or lower part has a horizontal surface that is provided with one or more posts on which the printed circuit board is mounted.

6. The assembly as claimed in claim 1, wherein the panel has a vertical surface that is positioned against the frame, and forms part of the lower part of the panel.

7. The assembly as claimed in claim 6, wherein the vertical surface that is positioned against the frame has one or more clips or recesses that engage corresponding recesses or clips in the upper part of the panel.

8. The assembly as claimed in claim 7, wherein at least the upper part is sufficiently flexible to allow disengagement of the clips and recesses by manually pulling the upper part from the lower part.

9. The assembly as claimed in claim 1, wherein the lower part has an aperture through which a cable between the circuit board and the frame extends.

10. The assembly as claimed in claim 6, wherein the vertical surface that is positioned against the frame is secured thereto by means of a plurality of fasteners.

11. The assembly as claimed in claim 1, wherein the frame has a vertical flange at either side thereof, each flange being located in the region of a side of the panel.

12. The assembly as claimed in claim 11, wherein the panel includes a projection that extends along either side thereof the projection being received in a slot in each flange.

13. The assembly as claimed in claim 12, wherein the projections and the slots are generally horizontal.

14. The assembly as claimed in claim 6, wherein the vertical surface that is positioned against the frame has at least one protuberance or recess that engages a corresponding recess or protuberance in the surface of the frame to locate the panel against the frame.

15. The assembly as claimed in claim 11, wherein each flange has an aperture therein, and the panel has a retaining element at each side thereof that is received in the aperture in the flange.

16. The assembly as claimed in claim 15, wherein each retaining element is in the form of a resilient arm that has a tooth in the region of an end thereof that is received in the aperture.

17. The assembly as claimed in claim 16, wherein the tooth has a bevelled surface that causes the arm to bend when the panel is being located on the frame, and has a shoulder that retains the tooth in the aperture.

18. The assembly as claimed in claim 16, wherein each resilient arm extends downwardly from the upper part of the panel.

19. The assembly as claimed in claim 16, wherein each arm resists relative movement of the panel and the frame in the plane of the flange.

20. The assembly of claim 1, wherein the printed circuit board is positioned between the upper part and the lower part on posts attached to the upper part or lower part.

21. The assembly of claim 1, wherein the printed circuit board is substantially enclosed by the upper part and the lower part.

22. A frame for a network server assembly, which has:
(i) a facia panel that is attached to a surface of the frame, the facia panel being formed as an upper and a lower part that are retained together, through at least one detechable fastener, generally horizontally, and
(ii) a printed circuit board for providing information relating to the assembly, the printed circuit board being located within the facia panel between the two parts;
wherein, the frame and the fascia panel have a locating element at each side of the fascia panel for ensuring correct positioning of the panel with respect to the frame;
wherein the frame encloses a number of components including a motherboard and a plurality of daughter-boards coupled to the motherboard.

23. A fascia panel that can be attached to a frame of a network server assembly, the panel comprising:
(i) an upper and a lower part that are retained together, through at least one detachable fastener generally horizontally, and
(ii) a printed circuit board for providing information relating to the assembly, the printed circuit board being located within the facia panel between the two parts;
wherein, the frame and the fascia panel have a locating element at each side of the fascia panel for ensuring correct positioning of the panel with respect to the frame;
wherein the frame encloses a number of components including a motherboard and a plurality of daughter-boards coupled to the motherboard.

* * * * *